United States Patent [19]

Ohnishi et al.

[11] Patent Number: 5,200,977
[45] Date of Patent: Apr. 6, 1993

[54] TERMINAL UNIT APPARATUS FOR TIME DIVISION MULTIPLEXING ACCESS COMMUNICATIONS SYSTEM

[75] Inventors: Hiroshi Ohnishi, Tokyo; Yuuri Yamamoto, Yokohama; Kouei Misaizu, Kawasaki, all of Japan

[73] Assignee: Matsushita Electric Industrial Co., Ltd., Osaka, Japan

[21] Appl. No.: 660,054

[22] Filed: Feb. 25, 1991

[30] Foreign Application Priority Data

Feb. 23, 1990 [JP] Japan ................... 2-43016

[51] Int. Cl.$^5$ .................. H03H 7/30; H03H 7/40; H04B 7/10
[52] U.S. Cl. ........................ 375/15; 375/100; 375/97; 455/255; 329/346; 370/58.1
[58] Field of Search ............ 375/15, 100, 97, 118, 375/12, 14, 103; 364/724.2; 329/346, 304; 455/142-255; 370/58.1, 84, 93

[56] References Cited

U.S. PATENT DOCUMENTS 4,383,324  5/1983  Dudek et al. ............... 329/307 X
4,975,927  12/1990  Yoshida ..................... 375/15

Primary Examiner—Curtis Kuntz
Assistant Examiner—Tesfaldet Bocure
Attorney, Agent, or Firm—Pollock, VandeSande & Priddy

[57] ABSTRACT

A terminal unit apparatus for a time division multiplexing access radio communications system formed of a base station and a number of terminal units remote from the base station, includes a 2-dimensional adaptive equalizer circuit for equalizing two quadrature-relationship baseband signals which are obtained from a received quadrature digital modulation signal during receiving operation of the terminal unit, and an internal signal source which generates a local oscillator signal for use in demodulating a received signal to obtain these baseband signals. A frequency correction quantity is derived from the average rate of variation in each symbol interval of the ratio of the two main tap coefficients of the 2-dimensional adaptive equalizer circuit, and used to correct the frequency of operation of the internal signal source during both receiving operation and also in transmitting operation, in which the internal signal source provides a carrier signal for modulation. Frequency correction can thereby be achieved that is independent of the effects of multi-path interference to the transmission path upon the received quadrature digital modulation signal.

4 Claims, 4 Drawing Sheets

TERMINAL UNIT APPARATUS FOR TIME DIVISION MULTIPLEXING ACCESS COMMUNICATIONS SYSTEM

FIELD OF THE INVENTION

The present invention relates to a terminal unit apparatus for a time division multiplexing access system (abbreviated hereinafter to TDMA system) consisting of a base station and a plurality of remotely located terminal units which communicate with the base station, by radio. The terminal units may be fixedly located, e.g. at different locations within the same building as the base station, or may be mobile units which operate from moving vehicles.

DESCRIPTION OF THE RELATED ART

TDMA systems, which were originally developed for use in space satellite communications applications, are now being envisaged for such ground-based applications as small-scale networks in which a base station is linked by radio to a plurality of terminal units, for exchanging data at a high data rate between the base station and the terminal units. With a TDMA system, each terminal unit is allocated cyclically recurring transmission intervals of fixed duration, during which the terminal unit can transmit data to the base station, so that data can be transmitted in periodic bursts from each of the terminal units to the base station. Data to be transmitted are supplied to a terminal unit and held temporarily in a buffer, to be outputted and transmitted at a suitably high data rate during subsequent transmission intervals of that terminal unit. Such a communications system provides a greater degree of overall flexibility than is possible for example with a frequency division multiplexing system, i.e. with a TDMA system, reliable transmission can be achieved even if the data rate of the data to be transmitted varies to some extent.

However with such a TDMA system, to ensure reliable demodulation by the base station of digital data that are transmitted to it from the terminal units by modulated carrier waves, it is essential that the respective carrier frequencies of the various terminal units are all accurately fixed at a specific value. Here "carrier frequency" is used to signify the central frequency of the power spectrum of a transmitted modulated signal in the carrier band. If that condition is not satisfied, satisfactory operation cannot be achieved. One method which is known in the prior art for holding the transmitted carrier frequency of each terminal unit to a common fixed value is to control the carrier freq based upon the central frequency of the received modulated wave that is transmitted from the base station, by using a frequency discriminator, i.e. to control the frequency of an internal source of fixed-frequency signals (referred to in the following simply as an internal signal source) in the terminal unit on the basis of frequency information derived from the received modulated signal. More specifically, during receiving operation by a terminal unit, an internal signal source produces a local oscillator signal for use in demodulating the received signal from the carrier frequency band to the baseband range. In that case the output frequency of the internal signal source is corrected in accordance with the detected carrier frequency of the received signal. Subsequently, when that terminal unit enters a transmission operation interval, that internal signal source functions as a source of a carrier wave which is modulated in accordance with the digital data that are to be transmitted, with a quadrature modulation method being utilized. Since the frequency of the local oscillator signal produced by the internal signal source during receiving operation has been accurately fixed, based on the received carrier frequency, the carries frequency that is produced from that internal signal source for use in modulation during transmission operation can also be accurately determined. This can be done by setting the transmission carrier frequency at a predetermined value that is different from the local oscillator frequency value by a fixed amount, for example by changing the frequency division ratio of an internal frequency divider of a phase locked loop circuit which functions as the internal signal source. Thus, by accurately fixing the frequency of operation of the internal signal source during receiving operation by the terminal unit, the carrier frequency that is produced from that internal signal source during transmission operation by the terminal unit can also be accurately fixed.

However with such a method, basing control of the output signal frequency of the internal signal source upon the received modulated signal, by using a frequency discriminator, is equivalent to using the central frequency of the power spectrum of the received radio waves as a reference frequency. If there is only a single direct transmission path between the base station and the terminal unit, then accurate frequency correction can be achieved by that method. However if multi-path interference occurs, then problems will arise. Specifically, if the received radio waves which arrive at the antenna of a terminal unit are a combination of waves which have travelled via transmission paths of respectively different length (due to reflections from buildings or other obstacles, for example), then interference will occur in the received signal between waves which have travelled for respectively different path lengths and hence have been delayed by respectively different amounts. One problem which results from this is that the central frequency of the power spectrum of the received waves will differ from that of the originally transmitted signal from the base station. This is illustrated in FIG. 1, in which numeral 1 indicates a received power spectrum for the case in which multi-path interference does not occur, and 2 and 3 show examples in which such multi-path interference does occur. As shown, the multi-path interference results in the frequency distribution of the spectrum being skewed with respect to the original carrier frequency. Moreover in the case of a terminal unit operating from a moving vehicle, such effects of multi-path interference will vary with time. Thus, if such a frequency domain method of correcting the operating frequency of the internal signal source of the terminal unit is used, based on the frequency information contained in the received radio waves during receiving operation of the terminal unit, it becomes extremely difficult to set that operating frequency at a fixedly predetermined value during transmission operation by the terminal unit. As a result, the respective values of carrier frequency of the various terminal units of the system, i.e. the respective central frequency values of the transmitted modulated signals, may significantly differ from the desired fixed value. This results in difficulty in demodulating the signals received by the base station from the various terminal units.

SUMMARY OF THE INVENTION

It is an objective of the present invention to overcome the disadvantages of the prior art as set out above, by providing a terminal unit apparatus for a TDMA system formed of a base station and a plurality of terminal units, whereby substantially identical values of transmission carrier frequency can be established for each of the terminal units, based upon a received signal from the base station, and whereby the transmission carrier frequency of each terminal unit is not affected by multi-path interference resulting from reception via a number of transmission paths.

To achieve the above objectives, a terminal unit apparatus according to the present invention includes a 2-dimensional adaptive equalizer circuit for processing demodulated output signals from a quadrature demodulator, based upon a pair of transversal filters, and means for successively modifying the tap coefficients of the equalizer circuit, with successive tap coefficient values being derived by applying successive output signal values produced from the equalizer circuit to a predetermined algorithm. A correction voltage is derived based on an average rate of change, over a number of symbol intervals of the received data, of a value which is a function of a specific pair of the tap coefficients. That is to say, the magnitude and direction of that average rate of change vary in accordance with an amount and direction of difference between the output frequency of the internal signal source of the terminal unit and the original carrier frequency of a received modulated signal, when the output from the internal signal source is used as a local oscillator signal for carrier demodulation during receiving operation. The output frequency of the internal signal source, when subsequently used as a carrier source during a transmission interval by the terminal unit, can thereby be fixedly established, based on the received modulated signal during the preceding receiving operation.

More specifically, the present invention provides, in a terminal unit apparatus for use in a time division multiplexing radio communications system. The terminal unit includes carrier demodulation means for demodulating a received quadrature digital modulation signal, transmitted from a base station, to an intermediate frequency band modulated signal. An internal signal source supplies to the carrier demodulating means a local oscillator signal for executing the demodulation, quadrature demodulation means demodulate the intermediate frequency band modulated signal to obtain two baseband signals in a quadrature relationship. A 2-dimensional adaptive equalizer circuit means including a pair of tapped delay lines, for executing waveform equalization of the baseband signals. A tap coefficient generating circuit means supplies to the 2-dimensional adaptive equalizer circuit means successively updated values of tap coefficients which include a pair of main tap coefficients respectively applied to centrally located tap positions of the delay lines. Data detection means recover the transmitted data from equalized output signals produced from the 2-dimensional adaptive equalizer circuit means. The improvement comprises means for deriving a frequency correction quantity based upon the main tap coefficients and for applying the correction quantity to correct a frequency error of the internal signal source.

As a result of deriving a frequency correction quantity on the basis of successively updated values of the main tap coefficients of an adaptive equalizer circuit which equalizes received demodulated baseband signals, rather than upon frequency domain information obtained from the received modulated signal, highly accurate frequency correction can be achieved for an internal signal source which generates a local oscillator signal for carrier demodulation during receiving operation of the terminal unit and which generates a carrier signal for use in modulation, during transmitting operation of the terminal unit. The accuracy of the frequency correction is unaffected by distortion of the power spectrum of the received modulated signal resulting from multi-path interference in the radio transmission path between the base station and that terminal unit.

DESCRIPTION OF PREFERRED EMBODIMENTS

Figure 2:
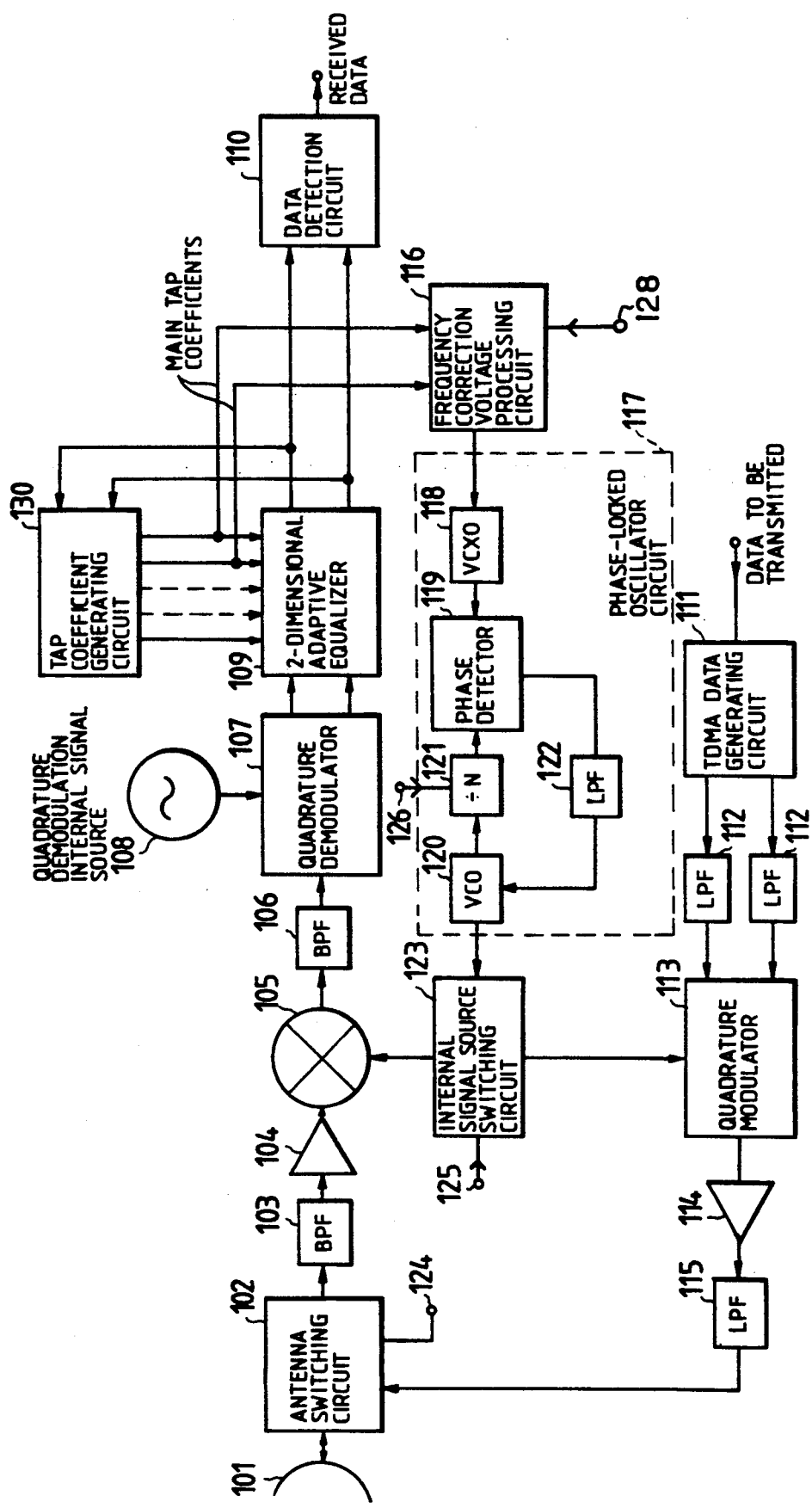
FIG. 2 is a block diagram of an embodiment of a terminal unit apparatus according to the present invention.

FIG. 2 is a block diagram of an embodiment of a terminal unit apparatus according to the present invention, for a terminal unit which forms part of a TDMA system consisting of a base station and a plurality of terminal units which communicate by radio with the base station. In FIG. 2, numeral 101 denotes a transmitting/receiving antenna, 102 denotes an antenna switching circuit, which is controlled by a transmit/receive control signal applied to a terminal 124 for changeover between a transmit condition, in which a modulated signal in the carrier frequency band is supplied from an input of the switching circuit to the antenna and a receive condition in which a received modulated signal is transferred from the antenna to an output of the switching circuit 102. The transmit/receive control signal applied to terminal 124 is generated by a circuit (omitted from the drawing for simplicity of description) which determines the aforementioned cyclically recurring transmission intervals of fixed duration for the circuit of FIG. 2. It will be assumed in the following that respective transmit/control signals are similarly applied to other control terminals 125, 126 and 128 for changeover of respective circuits between the transmitting and receiving conditions, as described hereinafter. However, in general, a single transmit/control signal could be applied in common to each of these terminals. Numeral 103 denotes a band pass filter inserted in the received signal path, for selecting the desired signal frequency range. An amplifier 104 amplifies the received signal from the antenna, and the resultant output signal is supplied to one input of a frequency mixer 105, to be combined with a local oscillator signal (described hereinafter) and thereby converted to an intermediate frequency band. Numeral 106 denotes a band pass filter which selects frequencies within the intermediate frequency band. The output signal from the filter 106 is supplied to a quadrature demodulator circuit 107, to be combined with a fixed-frequency signal supplied from a quadrature demodulation internal signal source 108 to obtain a pair of baseband demodulated output signals which are in a phase quadrature relationship, and will be referred to in the following as the quadrature channel signal and the inphase channel signal respectively. 109 denotes a 2-dimensional adaptive equalizer circuit, for applying waveform equalization to the quadrature channel signal and in-phase channel signal that are outputted from the quadrature demodulator circuit 107, to compensate for phase and amplitude distortion that has resulted from factors such as multi-path interference or a frequency error of a local oscillator signal that is supplied to the mixer 105 from a phase-locked oscillator circuit 117 (described hereinafter), with two resultant equalized baseband output signals being supplied from the 2-dimensional adaptive equalizer circuit 109 to the data detection circuit 110. As described in detail hereinafter, the 2-dimensional adaptive equalizer circuit 109 is basically a combination of two transversal filters, including a first tapped delay line through which the in-phase channel signal from the quadrature demodulator circuit 107 is passed and a second tapped delay line through which the quadrature channel signal is passed. The values of the tap coefficients (i.e. filter coefficients) of the 2-dimensional adaptive equalizer circuit 109 are updated in each of successive symbol intervals of the received digital data by a tap coefficient generating circuit 130, based on applying an appropriate algorithm to estimated amounts of error that are derived by sampling the output signals from the 2-dimensional adaptive equalizer circuit 109 once in each symbol interval of the received data. Since the principles of adaptive equalizers as applied to digital communications systems are now well known in the art, as are also suitable algorithms for computing the tap coefficients of such equalizers, detailed description of these will be omitted in the following. 110 denotes a data detection circuit for recovering the originally transmitted data from the equalized baseband signals produced from the 2-dimensional adaptive equalizer circuit 109.

In the transmission circuit path, numeral 111 denotes a TDMA data generating circuit for converting data that are to be transmitted, supplied thereto from an external source, into suitable form for transmission in successive bursts during the aforementioned predetermined TDMA transmission intervals, and also converts the data into two channels of data symbols, to be supplied to a quadrature modulator circuit 113 via respective low-pass filters 112. The filters 112 serve to exclude high-frequency components from the data, to limit the spectrum of the signals which will be subjected to quadrature modulation. An internal signal source switching circuit 123 is controlled by a transmit/receive control signal applied to a terminal 125, for transferring an output signal from the phase-locked oscillator circuit 117 to the mixer 105 as a local oscillator signal during receiving operation, and to the quadrature modulator circuit 113 as a carrier signal during each interval of transmission operation of the terminal unit. The quadrature modulator circuit 113 converts the data from the TDMA data generating circuit 111 into a quadrature digital modulation signal in the carrier frequency band, during transmission operation, with the central frequency of that signal being that of the output signal supplied from the phase-locked oscillator circuit 117 to the quadrature modulator circuit 113. The output signal from the quadrature modulator circuit 113 is amplified in an amplifier 114 to a standard level of transmission power, and transferred to the antenna switching circuit 102 and hence to the antenna 101 through a low pass filter 115 which excludes unwanted high frequency components produced in the amplifier 114 and the quadrature modulator circuit 113, i.e. transfers only signal components within the carrier frequency band.

During receiving operation of the terminal unit, a frequency correction voltage processing circuit 116 receives successive values of the main tap coefficients (described hereinafter) of the 2-dimensional adaptive equalizer circuit 109, and derives from these a quantity representing an estimated amount of frequency error of the output signal from the phase-locked oscillator circuit 117. and supplies a corresponding frequency correction voltage to the phase-locked oscillator circuit 117. The frequency correction voltage processing circuit 116 includes a sample-and-hold circuit which is controlled by a transmit/receive control signal applied to an input terminal 128 such that when a transmission interval of the terminal unit begins, the most recent value of frequency correction voltage to be outputted from the circuit is held unchanged, for the duration of the transmission interval. The output signal frequency of the phase-locked oscillator circuit 117 is thereby controlled during each transmission interval in accordance with frequency error information derived during the immediately preceding receiving interval.

During receiving operation by the terminal unit, the phase-locked oscillator circuit 117 constitutes the internal signal source for generating a local oscillator signal for carrier demodulation by the mixer 105, while during transmitting operation, the circuit serves to generate a carrier signal to be modulated in the quadrature modulator circuit 113. In the phase-locked oscillator circuit 117, a voltage controlled quartz crystal oscillator circuit 118 is controlled in frequency by the frequency correction voltage produced from the frequency correction voltage processing circuit 116, for producing an output frequency reference signal for controlling the output signal frequency of a phase locked loop (PLL) circuit. That phase locked loop circuit is formed by a phase detector circuit 119, a low pass filter 122 which is a loop filter for a frequency control voltage produced from the phase detector circuit 119, a voltage controlled oscillator (hereinafter VCO) 120 whose operating frequency is controlled by the output from the filter 122 and which produces the output signal of the phase-locked oscillator circuit 117, and a variable frequency divider circuit 121. The frequency division ratio of the variable frequency divider circuit 121 is set to a first fixed value during transmission operation of the terminal unit and to a second fixed value during receiving operation, with changeover between these ratios being controlled by a transmit/receive control signal applied to a control terminal 126 of the frequency divider. The VCO 120 thereby outputs an output signal at a predetermined transmission carrier frequency during transmission operation (with the exact value of that signal frequency being determined by the division ratio of the variable frequency divider circuit 121 and by the frequency correction voltage produced from the frequency correction voltage processing circuit 116, which as stated above is held unchanged from the most recent value established during the preceding interval of receiving operation by the terminal unit), and produces an output signal during each interval of receiving operation at a frequency which differs from the central frequency of the originally transmitted modulated signal from the base station by the appropriate amount (as determined by the division ratio of the variable frequency divider circuit 121 and the frequency correction voltage from the frequency correction voltage processing circuit 116) for enabling accurate carrier demodulation by the mixer 105.

Figure 3:
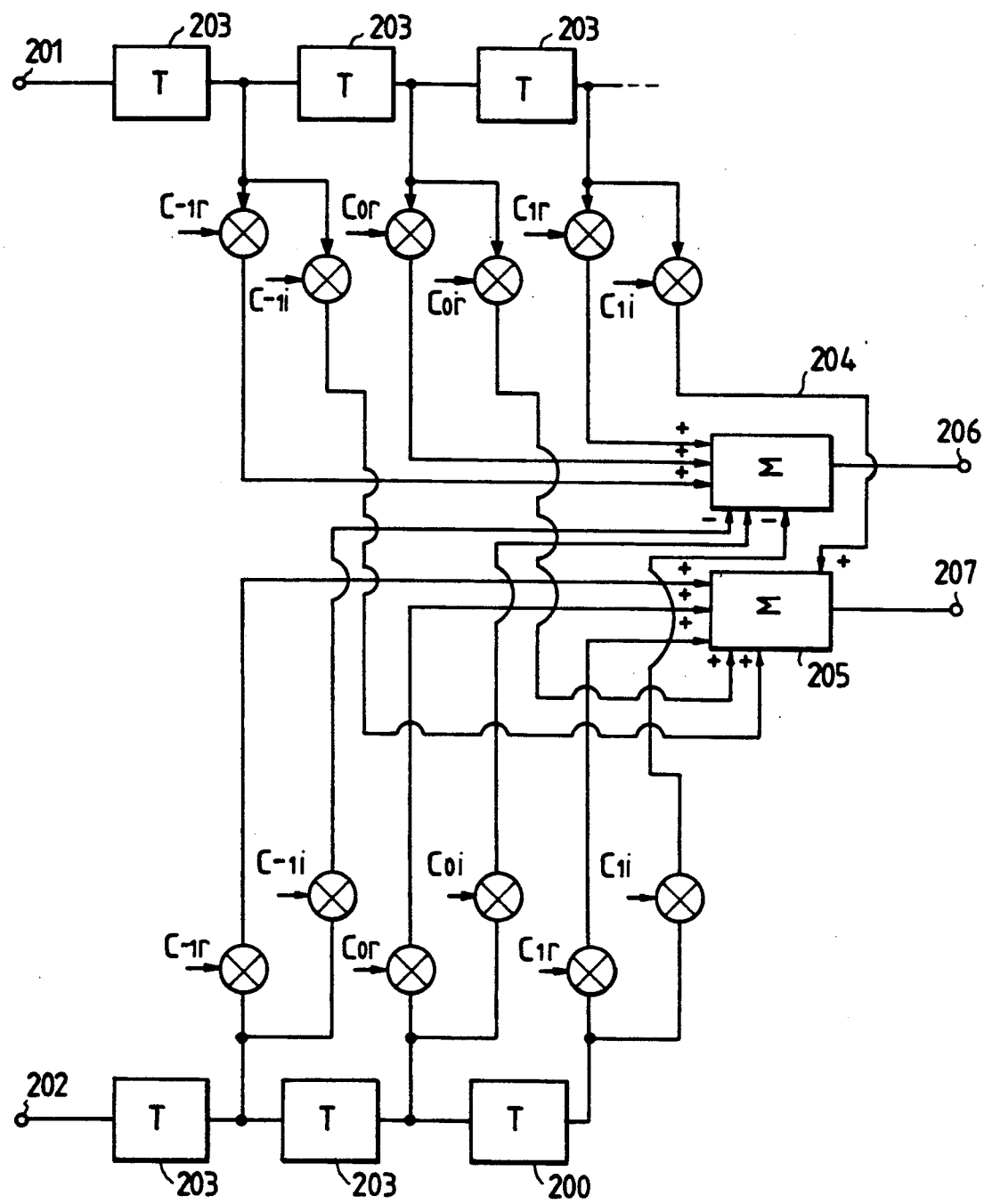
FIG. 3 is a block diagram of a 2-dimensional adaptive equalizer circuit in the embodiment of FIG. 2.

FIG. 3 is a block diagram for describing the basic features of the 2-dimensional adaptive equalizer circuit 109. For simplicity of description it is assumed that each tapped delay line consists of only three delay stages. In FIG. 3, 201 and 202 denote input terminals for receiving the in-phase and quadrature channel baseband signals respectively, from the quadrature demodulator circuit 107. Each of the blocks which are designated by numeral 203 is a delay circuit which produces a delay of exactly one symbol interval of the received data. 204 and 205 denote adders, and 206, 207 denote output terminals from which the respective equalized quadrature baseband signals from the adders 204, 205 are supplied to the data detection circuit 110. The tap coefficients that are supplied from the tap coefficient generating circuit 130 as described above are designated as $C_{-1r}$, $C_{-1i}$, $C_{0r}$, $C_{0i}$, $C_{1r}$ and $C_{1i}$. Of these, each tap coefficient whose subscript contains the letter "r" is a coefficient having the function of cancelling intersymbolic interference in the in-phase channel signal produced from the 2-dimensional adaptive equalizer circuit 109, while each tap coefficient whose subscript contains the letter "i" is a coefficient having the function of cancelling intersymbolic interference in the quadrature channel signal.

The tap coefficients $C_{0i}$ and $C_{0r}$, which respectively act on the centrally located tap outputs of the tapped delay lines (formed of the delay circuits 203) that are coupled to the input terminals 201 and 202, will be referred to in the following as the main tap coefficients. During receiving operation of the terminal unit, if there is a frequency error of the output signal from the phase-locked oscillator circuit 117 such that:

$$f_{RF} - f_{LR} > f_{2F},$$

where $f_{RF}$ is the center frequency of the originally transmitted digital modulation signal from the base station, $f_{LR}$ is the output frequency of the phase-locked oscillator circuit 117 (i.e. from the VCO 120), and $f_{2F}$ is the output frequency of the quadrature demodulation internal signal source 108, and if there is absolutely no multi-path interference in the radio wave transmission path, then the values of the main tap coefficients $C_{0r}$ and $C_{0i}$ are mutually related by a time-varying function which can expressed by the following equation:

$$\tan^{-1}(C_{0i}/C_{0r}) = +K \cdot t$$

where t denotes time, and K is a value whose magnitude varies in accordance with the aforementioned frequency error.

Conversely, if:

$$f_{RF} - f_{LR} < f_{2F},$$

and again if there is absolutely no multi-path interference in the radio wave transmission path, then the main tap coefficients are related as:

$$\tan^{-1}(C_{0i}/C_{0r}) = -K \cdot t$$

In either case, the main tap coefficients take successive values in each symbol interval whereby intersymbolic interference is prevented. Moreover, in either of the above conditions, i.e. when there is no multi-path interference affecting the received signal, each of the other tap coefficients, which act on tap outputs that are located prior to or subsequent to the central tap positions (i.e. $C_{-1r}$, $C_{-1i}$, $C_{1r}$ and $C_{1i}$ in the example of FIG. 3) takes a value that can be assumed to be zero.

Figure 1:
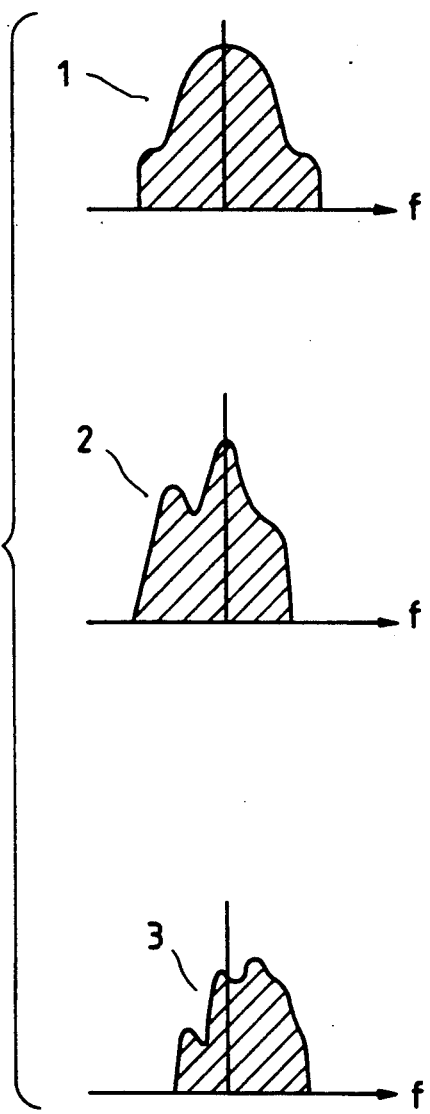
FIG. 1 illustrates the effects of multi-path interference upon the frequency power spectrum of a received quadrature digital modulation signal.

If multi-path interference occurs in the transmission path from the base station to the terminal unit, then respective values of these other tap coefficients ($C_{-1r}$, $C_{-1i}$, $C_{1r}$ and $C_{1i}$) will become other than zero, i.e. will take appropriate values for cancelling the effects of the multi-path interference on the in-phase and quadrature channel demodulated signals, such as to suppress intersymbolic interference. However the relationship between the main tap coefficients will not be changed as a result of the occurrence of multi-path interference. This fact makes it possible to use the aforementioned quantity K for deriving a correction quantity to be applied to control the phase-locked oscillator circuit 117. That is to say, even if the frequency spectrum distribution of the received modulated signal becomes skewed due to multi-path interference, for example as illustrated by 2 and 3 in FIG. 1, that will have no effect upon such a frequency correction quantity. This is due to the fact that the values of the main tap coefficients are successively updated by the tap coefficient generating circuit 130 based upon estimated error information that is derived within the tap coefficient generating circuit 130. The equalized baseband demodulated quadrature signals that are outputted from the 2-dimensional adaptive equalizer circuit 109 are sampled, so that frequency error information contained in the aforementioned value K, obtained from the main tap coefficient values, is not dependent upon frequency discrimination using the received modulated signal.

Figure 4:
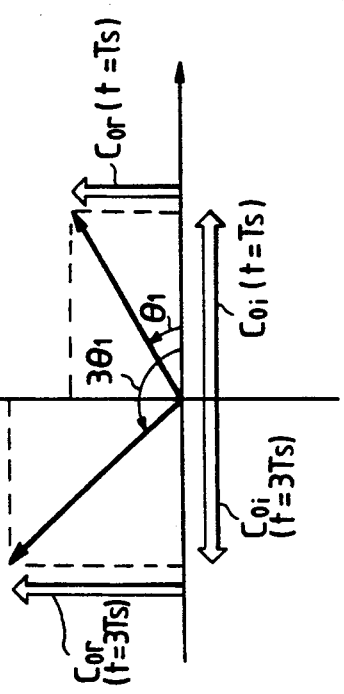
FIG. 4 is a polar diagram illustrating a relationship between main tap coefficients in the 2-dimensional adaptive equalizer circuit of FIG. 3.

The value K can be considered as a phase value, so that if the average amount of change of that phase value in each symbol interval is designated as $\theta_1$, and the symbol interval of the received data is designated as Ts, changes in that phase can be represented in polar coordinates as shown in FIG. 4. Here, $C_{0r}(t=Ts)$ and $C_{0i}(t=Ts)$ denote respective values of the main tap coefficients $C_{0r}$ and $C_{0i}$ at the end of one symbol interval, i.e. corresponding to a phase shift of $\theta_1$, while $C_{0r}(t=3Ts)$ and $C_{0i}(t=3Ts)$ denote the values of $C_{0r}$ and $C_{0i}$ after two more symbol intervals have elapsed, so that a total phase shift of $3\theta_1$ has occurred. In an actual apparatus, the values of the tap coefficients derived by the tap coefficient generating circuit 130 are themselves based on successive estimated error values, so that to derive an accurate value of frequency correction quantity based on the rate of change of $\tan^{-1}(C_{0i}/C_{0r})$, it is necessary to obtain the average value of a number of successive values of $\theta_1$.

Figure 5:
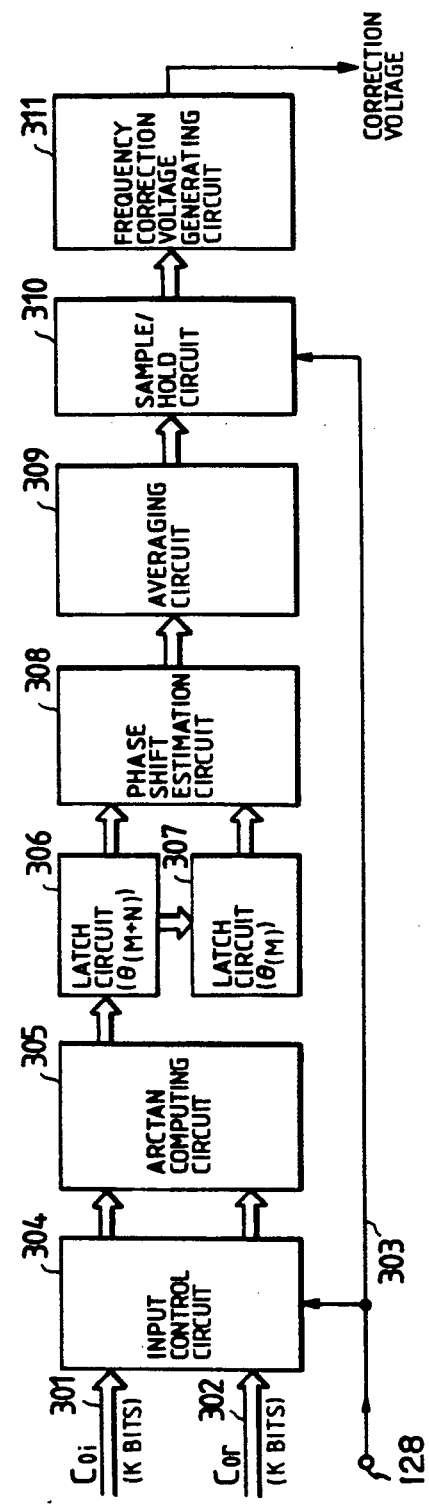
FIG. 5 is a block diagram of a frequency correction voltage processing circuit in the embodiment of FIG. 2.

FIG. 5 is a block diagram showing the internal configuration of the frequency correction voltage processing circuit 116 of FIG. 2. Digital processing is executed throughout. The successively updated values of $C_{0i}$ and $C_{0r}$ are outputted from the tap coefficient generating circuit 130 as digital values each consisting of k bits, where k is a fixed integer, which are transferred through an input control circuit 304 to an arctan computing circuit 305 when the terminal unit is in receiving operation. The arctan computing circuit 305 computes from each pair of $C_{0i}$, a corresponding value of phase $\theta$ The change in phase that occurs over a time interval equal to $(M+N)T_s$ is set into a latch circuit 306, as the quantity $\theta_{(M+N)}$, where M and N are fixed integers, and the change in phase that occurs over a time interval equal to $M.T_s$ is set into a latch circuit 307, as the quantity $\theta_{(M)}$. These latched values are supplied to a phase shift estimation circuit 308, in which an estimated amount of phase shift occurring in each symbol interval is computed, as $(\theta_{(M+N)} - \theta_M)/N$. When the contents of the latch circuits 306, 307 have been transferred to the phase shift estimation circuit 308, new values of phase are thereafter set into the latches, for use by the phase shift estimation circuit 308 in computing another estimated amount of phase shift in one symbol interval. An averaging circuit 309 computes the average value of these amounts of estimated phase shift per symbol interval, with the averaging being performed over several tens of successive estimated values produced from the phase shift estimation circuit 308. The resultant average amount of phase shift per symbol interval is then transferred to a sample-and-hold circuit 310, and held there until a succeeding average value is supplied from the averaging circuit 309.

A frequency correction voltage generating circuit 311 generates a frequency correction signal, which in this embodiment is a frequency correction voltage, with a magnitude that is based upon the magnitude of the average value supplied from the sample-and-hold circuit 310, and with a polarity that is determined by the direction of that average value of phase shift.

The transmit/receive control signal from the input terminal 128 is supplied to a line 303 control the input control circuit 304 and sample-and-hold circuit 310 such that during receive operation of the terminal unit, successive values of the main tap coefficients are supplied to the arctan computing circuit 305, and resultant updated values from the averaging circuit 309 are supplied to and outputted from the sample-and-hold circuit 310, and such that from the start of each transmission interval of the terminal unit, the supply of main tap coefficient values to the arctan computing circuit 305 is interrupted and the most recent value of the quantity "average amount of phase shift per symbol interval" supplied to the sample-and-hold circuit 310 is held fixedly outputted therefrom.

In this way, the frequency correction voltage that is produced from the frequency correction voltage generating circuit 311 in each transmission interval is derived during the preceding receiving interval, and is free from the effects of any multi-path interference that may have occurred during that receiving interval, so that the output signal frequency of the phase-locked oscillator circuit 117 during each transmission interval (and hence the center frequency value of the carrier band quadrature modulated signal that is transmitted by the terminal unit) can be held at a predetermined value with a high degree of accuracy. Thus the method of frequency stabilization used in the present invention provides significant advantages over prior art methods which are based upon frequency information contained in the received signal, i.e. upon discrimination of the center frequency of the received modulated signal, and which are thereby affected by multi-path interference.

What is claimed is:

1. In a terminal unit apparatus of a time division multiplexing radio communications system, including carrier demodulation means for demodulating a received quadrature digital modulation signal, transmitted from a base station, to an intermediate frequency band modulated signal, an internal signal source for supplying to said carrier demodulating means a local oscillator signal for executing said demodulation, quadrature demodulation means for demodulating said intermediate frequency band modulated signal to obtain two baseband signals in a quadrature relationship, 2-dimensional adaptive equalizer circuit means for executing waveform equalization of said baseband signals, tap coefficient generating circuit means for repetitively supplying to said 2-dimensional adaptive equalizer circuit means successively updated values of tap coefficients which include a pair of main tap coefficients, and data detection means for recovering transmitted data from equalized output signals produced from said 2-dimensional adaptive equalizer circuit means, the improvement comprising means for deriving a frequency correction signal having a value which is based upon the value of said main tap coefficients and for applying said frequency correction signal to correct a frequency error of said internal signal source.

2. A terminal unit apparatus according to claim 1, in which said frequency correction quantity is derived based upon an average rate of change of a phase value which varies cyclically in accordance with a ratio of said main tap coefficients.

3. A terminal unit apparatus according to claim 2, in which said frequency correction signal value deriving means comprises:

means for periodically estimating an amount of shift of said phase value occuring in each symbol interval of said data, to obtain successive values of estimated phase shift;

means for deriving successive average values of said estimated phase shift occurring in a symbol interval, each average value being taken over a plurality of successive ones of said estimated values;

means for successively holding and outputting each of said average values until a subsequent average value is derived; and means for deriving from an average value held in said holding means a frequency correction signal to be applied to said internal signal source.

4. A terminal unit apparatus according to claim 3 in which said internal signal source generates a carrier frequency signal for modulation use during intervals of transmission operation by the terminal unit apparatus, and in which said holding means is controlled at the start of each of said transmission intervals by said terminal unit apparatus such as to fixedly hold, for the duration of that transmission interval, a most recently acquired one of said average values.

* * * * *